United States Patent
Souchkov

(10) Patent No.: US 8,405,537 B2
(45) Date of Patent: Mar. 26, 2013

(54) SYSTEMS, DEVICES AND METHODS FOR CAPACITOR MISMATCH ERROR AVERAGING IN PIPELINE ANALOG-TO-DIGITAL CONVERTERS

(75) Inventor: Vitali Souchkov, Walnut Creek, CA (US)

(73) Assignee: Pixart Imaging Inc., Hsin-Chu (TW)

( * ) Notice: Subject to any disclaimer, the term of this patent is extended or adjusted under 35 U.S.C. 154(b) by 111 days.

(21) Appl. No.: 13/208,318

(22) Filed: Aug. 11, 2011

(65) Prior Publication Data

US 2013/0038478 A1 Feb. 14, 2013

(51) Int. Cl.
H03M 1/38 (2006.01)
(52) U.S. Cl. .......................... 341/161; 341/155; 341/156
(58) Field of Classification Search .................. 341/161, 341/155, 156
See application file for complete search history.

(56) References Cited

U.S. PATENT DOCUMENTS

| | | | |
|---|---|---|---|
| 6,184,809 B1 | 2/2001 | Yu | |
| 6,617,992 B2 | 9/2003 | Sakurai | |
| 6,734,818 B2 | 5/2004 | Galton | |
| 7,030,804 B2 | 4/2006 | Yoshioka et al. | |
| 7,612,703 B2 | 11/2009 | Chen et al. | |
| 7,852,254 B1 * | 12/2010 | Ginetti | 341/172 |
| 7,965,217 B2 * | 6/2011 | Murden et al. | 341/161 |

FOREIGN PATENT DOCUMENTS

| | | |
|---|---|---|
| CN | 101777917 | 7/2010 |
| EP | 0930715 | 7/1999 |

OTHER PUBLICATIONS http://ieeexplore.ieee.org/xpl/freeabs all.jsp?arnumber=826750 > On pp. 229-232; vol. 47; Publication date: Mar. 2000; Yun Chiu; Inherently Linear Capacitor Error-Averaging Techniques for Pipelined A/D Conversion.
http://ieeexplore.ieee.org/xpl/freeabs all.jsp?arnumber=718603 >; On pp. 1321-1323; vol. 45; Publication date: Sep. 1998; Rombouts, P.; Weyten, L.; A Digital Error-Averaging Technique for Pipelined A/D Conversion.
http://www.ece.mcgill.ca/~ahamoul/FILES/PUBLICATIONS/01705076.pdf >; vol. 53; Publication date: Sep. 2006; Mohammad Taherzadeh-Sani and Anas A. Hamoui; Digital Background Calibration of Capacitor-Mismatch Errors in Pipelined ADCs.

(Continued)

Primary Examiner — Jean B Jeanglaude
(74) Attorney, Agent, or Firm — McClure, Qualey & Rodack, LLP

(57) ABSTRACT

Various embodiments of methods and devices for reducing capacitor mismatch errors in a pipeline analog-to-digital converter (ADC) are disclosed, where in a pipeline element circuit and during a first phase, an input voltage provided by a sample-and-hold circuit is presented to first and second capacitors arranged in parallel in the pipeline element circuit. During a second phase, a second voltage corresponding to a second charge associated with the second capacitance is amplified and stored in the pipeline element circuit. During a third phase, the same input voltage of the first phase is again presented to the first and second capacitors, which are arranged in parallel in the pipeline element circuit. During a fourth phase a first voltage corresponding to the first charge is amplified and stored in the pipeline element circuit. After the first, second, third and fourth phases have been completed, digital representations of the first and second voltages are sent though corresponding registers for subsequent averaging along with digital representations of first and second voltages provided by other pipeline element circuits to produce a digital capacitor mismatch error corrected output.

29 Claims, 12 Drawing Sheets

OTHER PUBLICATIONS

Ion E. Opris, Laurence D. Lewicki, Bill C. Wong; A Single-Ended 12-bit 20 Msample/s Self-Calibrating Pipeline A/D Converter, IEEE Journal of Solid-State Circuits, vol. 33, No. 12, Dec. 1998.

Stephen H. Lewis, H. Scott Fetterman, George F. Gross, Jr., R. Ramachandran, T.R. Viswanathan; A 10-b 20-Msample/s Analog-to-Digital Converter; IEEE Journal of Solid-State Circuits, vol. 27, No. 3, Mar. 1992.

Hsin-Shu Chen, Bang-Sup Song, Kantilal Bacrania; A 14-b 20-MSamples/s CMOS Pipelined ADC; IEEE Journal of Solid-State Circuits, vol. 36, No. 6, Jun. 2001.

Charles Myers, Jipeng Li, Dong-Young Chang, Un-Ku Moon; Low Voltage High-SNR Pipeline Data Converters, 0-7803-8322-2/04/$20.00 c2004 IEEE.

Shang-Yuan (Sean Chuang, Terry L. Sculley; A Digitally Self-Calibrating 14-bit 10-MHz CMOS Pipelined A/D Converter, IEEE Journal of Solid-State Circuits, vol. 37, No. 6. Jun. 2002.

O. Bernal, F. Bony, P. Laquerre, M. Lescure; Digitally Self-Calibrated Pipelined Analog-to-Digital Converter, IMTC 2006 Instrumentation and Measurement Technology Conference, Sorrento, Itaty, Apr. 24-27, 2006; 0-7803-9360-0/06/$20.00 c2006 IEEE.

John P. Keane, Paul J. Hurst, Stephen H. Lewis; Background Interstage Gain Calibration Technique for Pipelined ADCs; IEEE Transactions on Circuits and Systems-I: Regular Papers, vol. 52, No. 1, Jan. 2005.

Ei-Sankary et al., "A Digital Blind Background Capacitor Mismatch Calibration Technique for Pipelined ADC," IEEE Transactions on Circuits and Systems, V.51, N10, Oct. 2004.

* cited by examiner

φ₁: FIRST SET OF SWITCHES 270
φ₂ₐ: SECOND SET OF SWITCHES 280
φ₂ᵦ: THIRD SET OF SWITCHES 290

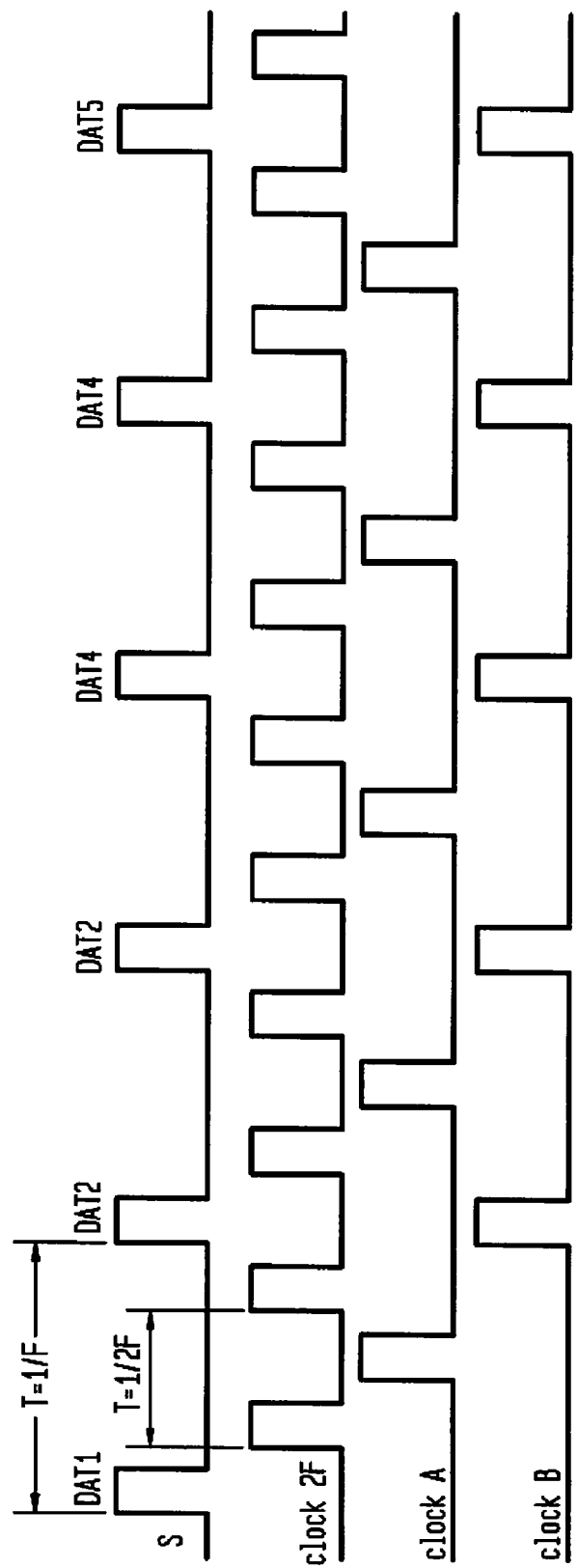

FIG. 9(b)

| CLOCK N, 2F | PIPELINE ELEMENT BIT LABEL | | | | | | | |
|---|---|---|---|---|---|---|---|---|
| | MSB | | MSB-1 | | MSB-2 | | MSB-3 | |
| | CONFIG. | DATA | CONFIG. | DATA | CONFIG. | DATA | CONFIG. | DATA |
| 1 | A | DAT1 | - | - | - | - | - | - |
| 2 | B | DAT1 | A | DAT1 | - | - | - | - |
| 3 | A | DAT2 | B | DAT1 | A | DAT1 | - | - |
| 4 | B | DAT2 | A | DAT2 | B | DAT1 | A | DAT1 |
| 5 | A | DAT3 | B | DAT2 | A | DAT2 | B | DAT1 |
| 6 | B | DAT3 | A | DAT3 | B | DAT2 | A | DAT2 |
| 7 | A | DAT4 | B | DAT3 | A | DAT3 | B | DAT2 |
| 8 | B | DAT4 | A | DAT4 | B | DAT3 | A | DAT3 |
| 9 | A | DAT5 | B | DAT4 | A | DAT4 | B | DAT3 |
| 10 | B | DAT5 | A | DAT5 | B | DAT4 | A | DAT4 |
| 11 | A | DAT6 | B | DAT5 | A | DAT5 | B | DAT4 |
| 12 | B | DAT6 | A | DAT6 | B | DAT5 | A | DAT5 |

FIG. 10

| BIT NUM. | 11 | 10 | 9 | 8 | 7 | 6 | 5 | 4 | 3 | 2 |
|---|---|---|---|---|---|---|---|---|---|---|
| $\frac{\delta C}{C}, \%$ RMS | 0.07029 | 0.08607 | 0.12173 | 0.17234 | 0.254 | 0.254 | 0.254 | 0.254 | 0.254 | 0.254 |
| C, fF | 1322 | 882 | 441 | 220 | 100.8 | 100.8 | 100.8 | 100.8 | 100.8 | 100.8 |

ADC DNL PLOT BEFORE CALIBRATION, ONE SAMPLE OF CAPACITOR DISTRIBUTION

ADC DNL PLOT AFTER CALIBRATION, ONE SAMPLE OF CAPACITOR DISTRIBUTION

SYSTEMS, DEVICES AND METHODS FOR CAPACITOR MISMATCH ERROR AVERAGING IN PIPELINE ANALOG-TO-DIGITAL CONVERTERS

FIELD OF THE INVENTION

Various embodiments of the invention described herein relate to the field of analog-to-digital converters (ADCs) generally, and to the field of ADCs incorporated into touchscreen and/or touchpad or touch panel controllers.

BACKGROUND

Increasing bit resolution in digital imaging applications for navigation (such as in capacitive touch screen integrated controllers, or in integrated optical imagers in OFN/mice) generally requires that steps be taken during the design phase to address problems arising from mismatches between integrated components in ADCs. Pipeline ADC architecture is frequently used in imaging applications because of its ability to simultaneously process multiple elements in imaging data arrays. In metal oxide silicon (MOS) pipeline ADCs and the integrated circuits into which they are incorporated, the most critical components to match are often the capacitors in the multiplication digital-to-analog converters (DACs) of each pipeline element. Capacitors, and especially large capacitors, can require large amounts of area on an integrated circuit, and may be difficult to design and implement when the effective number of bits (ENOB) in the ADC equals or exceeds 12. In addition, large capacitors can significantly increase the amount of power consumed by the ADC.

Numerous error calibration techniques have therefore been proposed with the aim of achieving high ENOB while not consuming excessive integrated circuit real estate and ADC power. Radix digital calibration techniques typically require substantial digital manipulation and prolonged reiterations during digital calibration. Averaging active and passive analog capacitors is another technique that has been used to increase the ENOB of pipeline ADCs, but which typically requires extra amplifiers and/or extra capacitors. In addition, an averaging clock phase, in addition to normal clock operations, is also typically required. These requirements add to integrated circuit size, complexity and design, and also increase the ADC power consumption.

Some publications discussing the foregoing problems include, but are not limited to: P. Rombouts et al., IEEE Transactions on Circuits and Systems, V.45, N9, September 1998; El-Sankary et al., IEEE Transactions on Circuits and Systems, V.51, N10, October 2004; Sean Chang, et. al., IEEE Journal of Solid State Circuits, V.37, N6, June 2002; Stephen H. Lewis, et. al., IEEE Journal of Solid State Circuits, V.27, N3, March 1992; John P. Keane, et. al., IEEE Journal on Circuits and Systems, V.52, N1, January 2005; O. Bernal, et al., IMTC 2006 Technology Conference, Sorrento, Italy, Apr. 24-27, 2006; Ion P. Opris, et. al., IEEE Journal of Solid State Circuits, V.33, N12, December 1998; Dong-Young Chang, et. al., IEEE Transactions on Circuits and Systems, V.51, N11, November 2004; Yun Chiu, et. al., IEEE Journal of Solid State Circuits, V.39, N12, December 2004, and Hsin-Shu Chen, IEEE Journal of Solid State Circuits, V.36, N6, June 2001. Each of the foregoing references is hereby incorporated by reference herein, each in its respective entirety.

What is needed is a pipeline ADC featuring reduced capacitor mismatch errors, smaller capacitors, and lower ADC power consumption

SUMMARY

In one embodiment, there is provided a pipeline element circuit in a pipeline analog-to-digital converter (ADC), comprising a sample-and-hold circuit configured to provide an input voltage at an output terminal, a first comparator comprising a first negative input terminal operably connected to a first reference voltage and a first positive input terminal operably connected to the input voltage, the first comparator providing a first comparator output, a second comparator comprising a second negative input terminal operably connected to a second reference voltage and a second positive input terminal operably connected to the input voltage, the second comparator providing a second comparator output, a multiplexer configured to receive as inputs thereto the first comparator output, the second comparator output, the first reference voltage, the second reference voltage, and ground, the multiplexer providing a multiplexer output representative of one of the first reference voltage, the second reference voltage, and ground, the multiplexer is output being provided in accordance with the first and second comparator outputs, and an amplifier circuit configured to receive the input voltage and the multiplexer output as inputs thereto, the amplifier circuit comprising an amplifier having an output and positive and negative amplifier inputs, the positive amplifier input being connected to ground, the amplifier circuit further comprising first, second and third sets of switches, and a first capacitance and a second capacitance, wherein during a first phase the first set of switches is closed, the second and third sets of switches are open, the first and second capacitors are arranged in parallel with respect to one another and are charged up by the input voltage through the first set of switches, during a second phase the first and second capacitors are arranged in series respecting one another, the second set of switches is closed and the first and third sets of switches are open, and through the second set of switches the second capacitor is placed in a negative feedback loop between the negative amplifier input and the amplifier output, the first capacitor is charged up by the multiplexer output provided thereto, and a second output voltage representative of the second capacitance is presented at the amplifier output, during a third phase the first set of switches is closed, the second and third sets of switches are open, the first and second capacitors are arranged in parallel with respect to one another and are charged up again by the same input voltage as in the first phase through the first set of switches, during a fourth phase the first and second capacitors are arranged in series respecting one another, the third set of switches is closed and the first and second sets of switches are open, and through the third set of switches the first capacitor is placed in the negative feedback loop, the second capacitor is charged up by the multiplexer output provided thereto, and a first output voltage representative of the first capacitance is presented at the amplifier output.

In another embodiment, there is provided a method of reducing capacitor mismatch errors in a pipeline analog-to-digital converter (ADC) comprising, in a pipeline element circuit, and during a first phase, presenting an input voltage provided by a sample-and-hold circuit to first and second capacitors arranged in parallel in the pipeline element circuit, in the pipeline element circuit, and during a second phase, amplifying a second voltage corresponding to a second charge associated with the second capacitance and storing the second voltage, in the pipeline element circuit, and during a third phase, again presenting the same input voltage of the first phase to the first and second capacitors arranged in parallel, in the pipeline element circuit, and during a fourth phase, amplifying a first voltage corresponding to the first charge and storing the first voltage, and, after the first, second, third and fourth phases have been completed, sending digital representations of the first and second voltages through corresponding registers to a digital averaging circuit for subsequent averaging, and providing a digital capacitor mismatch error corrected output therefrom. Further embodiments are disclosed herein or will become apparent to those skilled in the art after having read and understood the specification and drawings hereof.

BRIEF DESCRIPTION OF THE DRAWINGS

Different aspects of the various embodiments will become apparent from the following specification, drawings and claims in which:

FIG. 9(a) shows one embodiment of a control signal protocol corresponding to the pipeline ADC circuit of FIG. 8;

FIG. 9(b) shows one embodiment of corresponding data, clock and pipeline element configurations for the circuits of FIG. 6 and FIG. 8 when operated in accordance with the command signal protocol of FIG. 9(a).

FIG. 10 shows standard deviations of capacitor values for different pipeline circuit elements of a pilot ADC design;

The drawings are not necessarily to scale. Like numbers refer to like parts or steps throughout the drawings.

DETAILED DESCRIPTIONS OF SOME EMBODIMENTS

Figure 1:
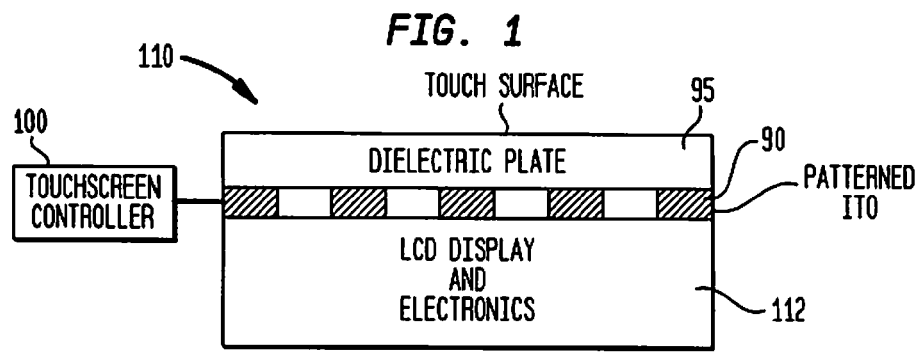
FIG. 1 shows a cross-sectional view of one embodiment of a capacitive touchscreen system.

As illustrated in FIG. 1, a capacitive touchscreen system 110 typically consists of an underlying LCD or OLED display 112, an overlying touch-sensitive panel or touchscreen 90, a protective cover or dielectric plate 95 disposed over the touchscreen 90, and a touchscreen controller, micro-processor, application specific integrated circuit ("ASIC") or CPU 100. Note that image displays other than LCDs or OLEDs may be disposed beneath touchscreen 90.

Figure 2:
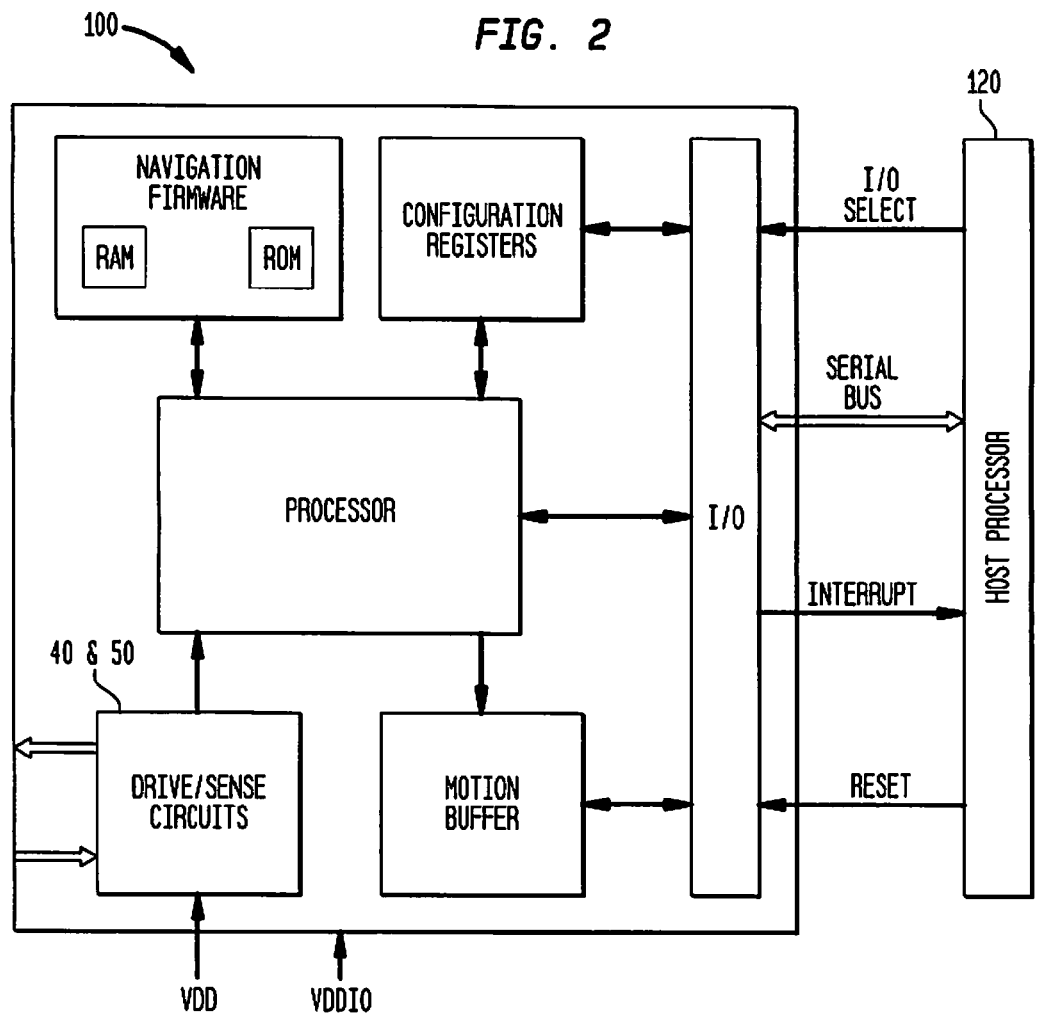
FIG. 2 shows a block diagram of a capacitive touchscreen controller.

FIG. 2 shows a block diagram of one embodiment of a touchscreen controller 100. In one embodiment, touchscreen controller 100 may be an Avago Technologies™ AMRI-5000 ASIC or chip 100 modified in accordance with the teachings presented herein. In one embodiment, touchscreen controller is a low-power capacitive touch-panel controller designed to provide a touchscreen system with high-accuracy, on-screen navigation.

Figure 3:
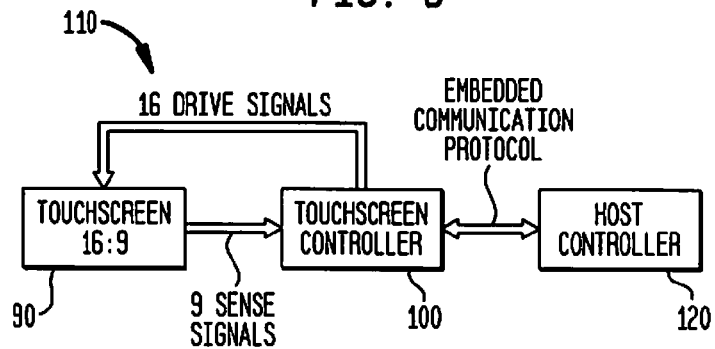
FIG. 3 shows one embodiment of a block diagram of a capacitive touchscreen system and a host controller.
Figure 4:
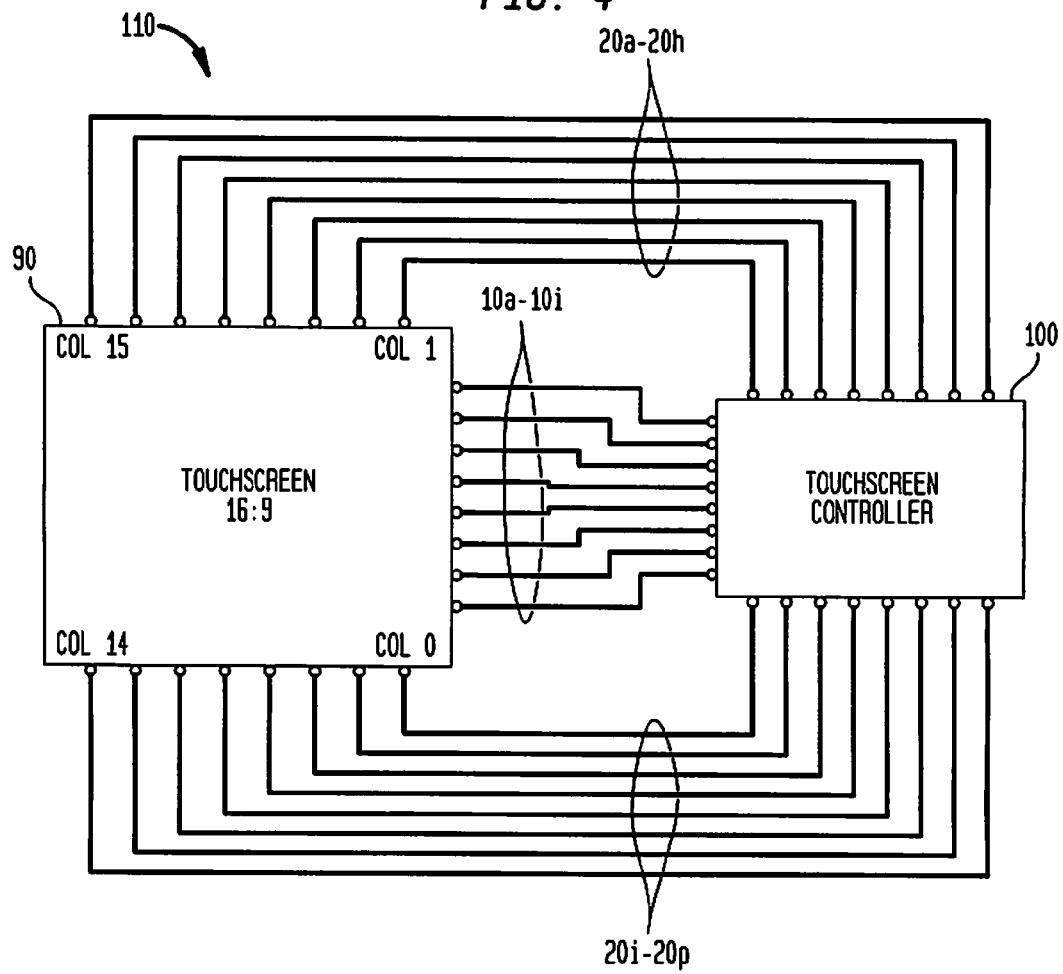
FIG. 4 shows a schematic block diagram of one embodiment of a capacitive touchscreen system.

Capacitive touchscreens or touch panels 90 shown in FIGS. 3 and 4 can be formed by applying a conductive material such as Indium Tin Oxide (ITO) to the surface(s) of a dielectric plate, which typically comprises glass, plastic or another suitable electrically insulative and preferably optically transmissive material, and which is usually configured in the shape of an electrode grid. The capacitance of the grid holds an electrical charge, and touching the panel with a finger presents a circuit path to the user's body, which causes a change in the capacitance.

Touchscreen controller 100 senses and analyzes the coordinates of these changes in capacitance. When touchscreen 90 is affixed to a display with a graphical user interface, on-screen navigation is possible by tracking the touch coordinates. Often it is necessary to detect multiple touches. The size of the grid is driven by the desired resolution of the touches. Typically there is an additional cover plate 95 to protect the top ITO layer of touchscreen 90 to form a complete touch screen solution (see, e.g., FIG. 1).

One way to create a touchscreen 90 is to apply an ITO grid on one side only of a dielectric plate or substrate. When the touchscreen 90 is mated with a display there is no need for an additional protective cover. This has the benefit of creating a thinner display system with improved transmissivity (>90%), enabling brighter and lighter handheld devices. Applications for touchscreen controller 100 include, but are not limited to, smart phones, portable media players, mobile internet devices (MIDs), and GPS devices.

Referring now to FIGS. 3 and 4, in one embodiment the touchscreen controller 100 includes an analog front end with 16 drive signal lines and 9 sense lines connected to an ITO grid on a touchscreen. Touchscreen controller 100 applies an excitation such as a square wave, meander signal or other suitable type of drive signal to the drive electrodes that may have a frequency selected from a range between about 40 kHz and about 200 kHz. The AC signal is coupled to the sense lines via mutual capacitance. Touching touchscreen or touch panel 90 with a finger alters the capacitance at the location of the touch. Touchscreen controller 100 can resolve and track multiple touches simultaneously. A high refresh rate allows the host to track rapid touches and any additional movements without appreciable delay. The embedded processor filters the data, identifies the touch coordinates and reports them to the host. The embedded firmware can be updated via patch loading. Other numbers of drive and sense lines are contemplated, such as 8×12 and 12×20 arrays.

Touchscreen controller 100 features multiple operating modes with varying levels of power consumption. In rest mode controller 100 periodically looks for touches at a rate programmed by the rest rate registers. There are multiple rest modes, each with successively lower power consumption. In the absence of a touch for a certain interval controller 100 automatically shifts to the next-lowest power consumption mode.

According to one embodiment, and as shown in FIG. 4, an ITO grid or other electrode configuration on touchscreen 90 comprises sense columns 20a-20p and drive rows 10a-10i, where sense columns 20a-20p are operably connected to corresponding sense circuits and rows 10a-10i are operably connected to corresponding drive circuits. One configuration for routing ITO or other drive and sense electrodes to lines to touchscreen controller 100 is shown in FIG. 4.

Those skilled in the art will understand that touchscreen controllers, micro-processors, ASICs or CPUs other than a modified AMRI-5000 chip or touchscreen controller 100 may be employed in touchscreen system 110, and that different numbers of drive and sense lines, and different numbers and configurations of drive and sense electrodes, other than those explicitly shown herein may be employed without departing from the scope or spirit of the various embodiments of the invention.

Figure 5:
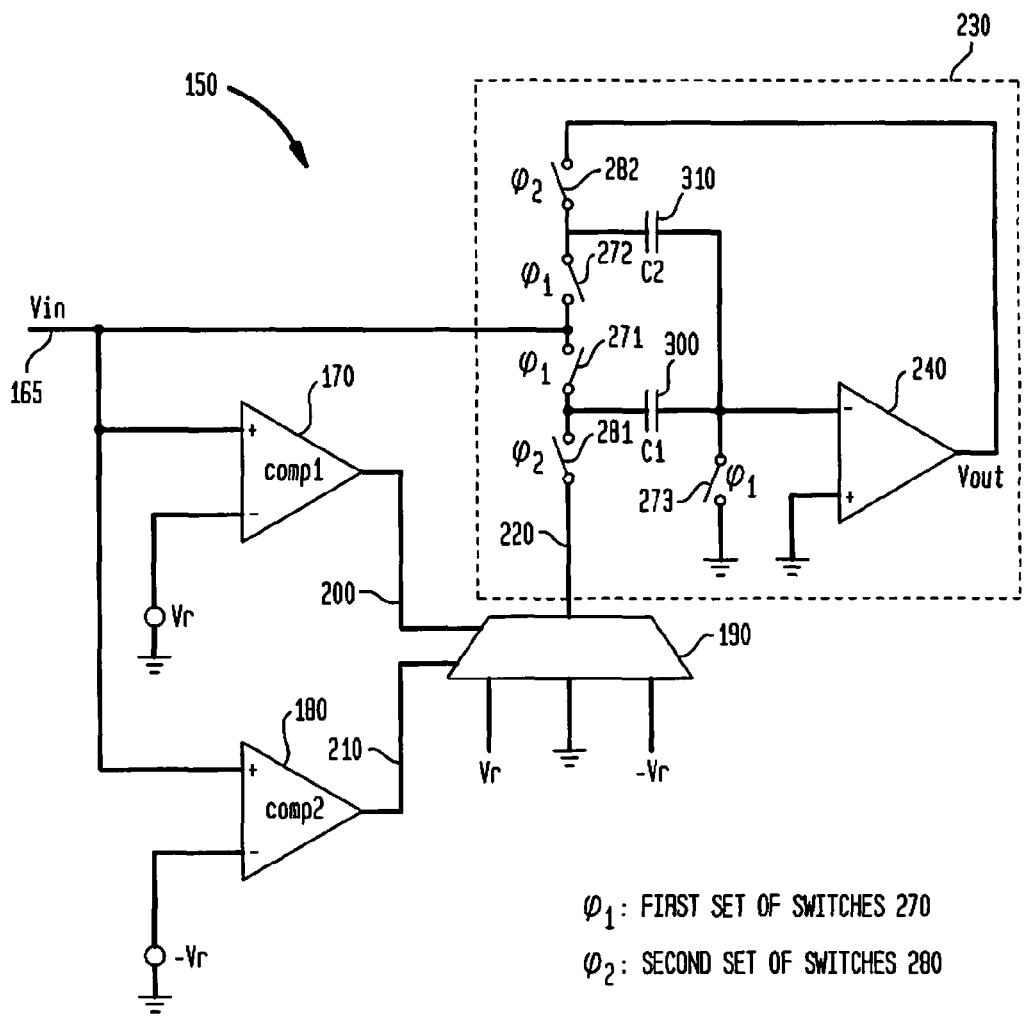
FIG. 5 shows one embodiment of a single pipeline element circuit 150 according to one embodiment of pipeline analog-to-digital converter (ADC) 155.
Figure 6:
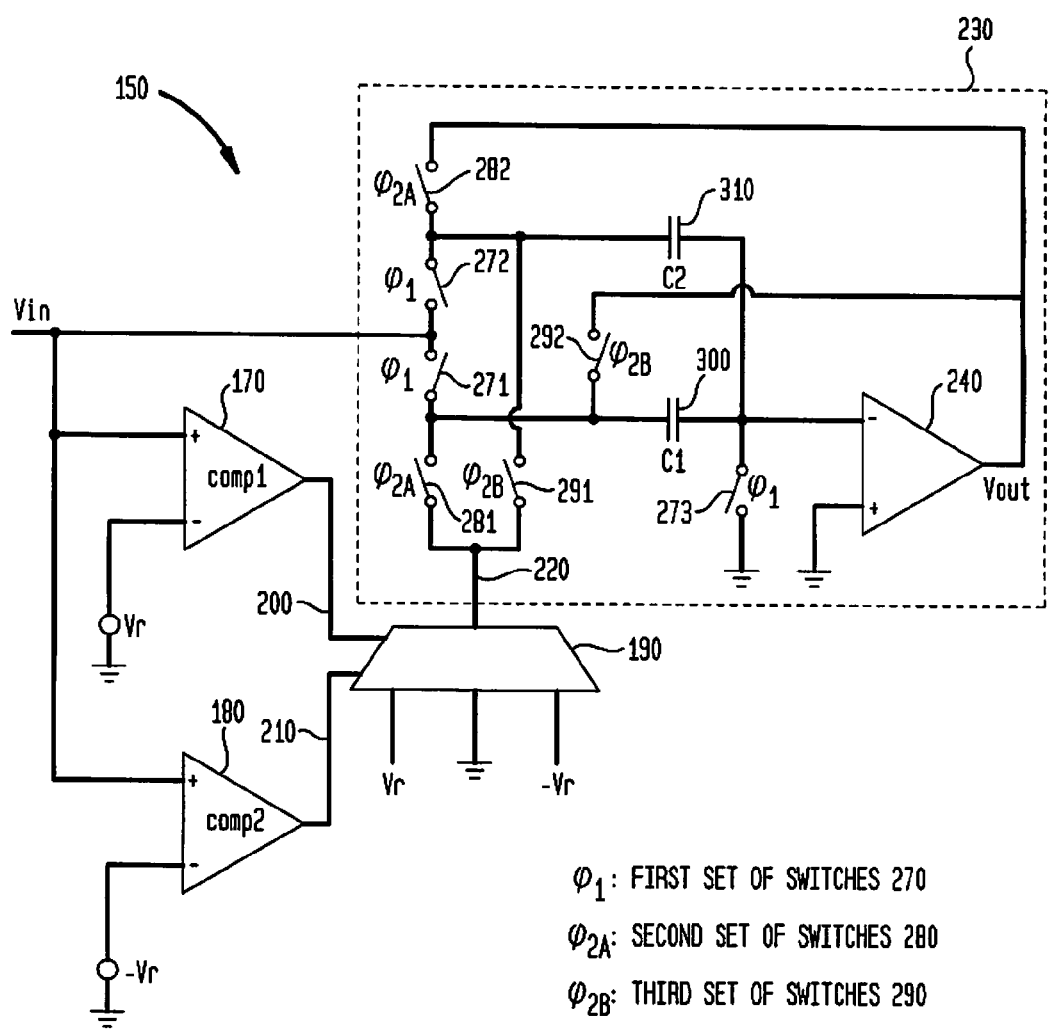
FIG. 6 shows another embodiment of a single pipeline element circuit 150 of pipeline ADC 155.

Referring now to FIGS. 5 and 6, it is to be understood that each of single pipeline element circuits 150 shown therein is but one of a plurality of similar pipeline element circuits in a pipeline ADC, where the pipeline element circuits are each configured to provide analog voltages and digital representations corresponding to one bit from among a plurality of pipeline element circuits and corresponding bits, and where the plurality of bits form a digital word output by the pipeline ADC. In addition, and continuing to refer to both FIGS. 5 and 6, the details of the digital circuitry associated with pipeline element circuits 150 are not shown in such Figures to avoid obscuring the analog circuitry elements of circuits 150. For example, the standard digital outputs provided by comparators 170 and 180 to the individual registers associated therewith are not shown in FIGS. 5 and 6, as those skilled in the art of pipeline ADC architecture will understand and appreciate immediately. Moreover, input voltage Vin shown in FIGS. 5 and 6 is provided by a sample-and-hold circuit (see FIG. 8). This is true, however, only for the first pipeline element circuit 50*a* shown in FIG. 8; the remaining pipeline element circuits 150*b* through 150*k* receive as inputs thereto the outputs provided by preceding pipeline element circuits.

Turning to FIG. 5, single pipeline element circuit 150 of pipeline ADC 155 (see FIG. 8) has no capacitor mismatch error averaging capability. A first set of switches labeled $\phi_1$ correspond to a first phase of signal acquisition. A second set of switches labeled $\phi_2$ are closed in a second multiplication phase before which switches closed in the first phase are opened. The first and second sets of switches are operated by non-overlapping control signals. Signal transformation in pipeline element circuit 150 of FIG. 5 may be described as follows:

$$(C_1 + C_2)V_{in} - DV_r = C_2 V_{out} \quad (1)$$

where D is a numeric term corresponding to the input signal value $V_{in}$ provided to comparators 170 and 180 so that:

D=1 if $Vin > Vr > -Vr$

D=0 if $Vr > Vin > -Vr$

D=-1 if $Vin < -Vr < Vr$

Ideally, equal value capacitors $C_1$ (300) and $C_2$ (310) are employed in pipeline element circuit 150. In actual practice, capacitors 300 and 310 will deviate from ideal values due to process and mask variations. As a result, capacitor mismatch may be described by introducing parameter $\delta$ as follows:

$$\frac{C_1 - C_2}{C_2} = \delta, \; \frac{C_1}{C_2} = \delta + 1 \quad (2)$$

Pipeline element circuit 150 of FIG. 6 allows the functionality of capacitors 300 and 310 to be switched during two multiplication phases (i.e., during second and fourth phases) through the addition of two switches to pipeline element circuit 150 of FIG. 5. In pipeline element circuit 150 of FIG. 6, switches labeled $\phi_{2A}$ (281 and 282) form a second set of switches 280 that permit the connection of capacitor $C_2$ (310) to the negative feedback loop of amplifier 240 while capacitor $C_1$ (300) is connected to reference voltages $-V_r$, 0 and $V_r$ depending on the value of D that has been selected by multiplexer 190 in accordance with the signal value that has been detected by comparators 170 and 180. Such a connection is similar to that described above with respect to the second phase of pipeline element circuit 150 of FIG. 5, and in circuit 150 of FIG. 6 is carried out by switches $\phi_{2A}$ instead of by switches $\phi_2$ in circuit 150 of FIG. 5. In a fourth multiplication phase, switches labeled $\phi_{2B}$ (291, 292) form a third set of switches 290 configured to connect capacitor $C_1$ (300) to the negative feedback loop of amplifier 240 while capacitor $C_2$ (310) is connected to one of reference voltages $-V_r$, 0 and $V_r$ (which also depends on the value of D that has been selected by multiplexer 190 in accordance with the signal value that has been detected by comparators 170 and 180. Similar to equation 1 above describing signal transformation for the second phase corresponding to switches $\phi_{2A}$, an expression may be derived for the fourth phase as follows:

$$V_{out} = V_{in}\left(\frac{C_2}{C_1} + 1\right) - DV_r \frac{C_2}{C_1} \quad (3)$$

The mismatch error parameter $\delta$ introduced in expression (2) contributes to pipeline element circuit 150 signal transformations in respective A and B configurations as follows:

$$V_{outA} = V_{in}(\delta + 2) - DV_r(\delta + 1) \quad (4A)$$

$$V_{outB} = V_{in}\frac{\delta + 2}{\delta + 1} - DV_r\frac{1}{(\delta + 1)} \quad (4B)$$

Applying expression (4A) recursively along the successive pipeline element circuits of ADC 155, and assuming that major pipeline element circuit 150 outputs are supplied as inputs to lesser pipeline element circuits 150, sorting of respective input signals is obtained for one polarity of a measured signal in a 12 bit pipeline ADC 155 as follows:

$$N_{countA} = D_{11}(\delta_{11} + 1)(\delta_{10} + 2)(\delta_9 + 2) \ldots (\delta_2 + 2) + \quad (5A)$$
$$D_{10}(\delta_{10} + 1)(\delta_9 + 2)(\delta_8 + 2) \ldots (\delta_2 + 2) +$$
$$D_9(\delta_9 + 1)(\delta_8 + 2)(\delta_7 + 2) \ldots (\delta_2 + 2) +$$
$$\ldots D_3(\delta_3 + 1)(\delta_2 + 2) + D_2(\delta_2 + 1) + D_1$$

where $N_{countA}$ is an integer number representing a digital conversion code in counts to corresponding to bit states (1 or 0) of $D_{11}$ through $D_1$, and $\delta i$- corresponds to capacitor mismatches in the i-th pipeline element circuit. Similarly, equation 4B may be employed to derive the digital conversion code for $N_{countB}$ as follows:

$$N_{countB} = D_{11}\frac{1}{(\delta_{11} + 1)}\frac{(\delta_{10} + 2)(\delta_9 + 2)\ldots(\delta_2 + 2)}{(\delta_{10} + 1)(\delta_9 + 1)\ldots(\delta_2 + 1)} + \quad (5B)$$

-continued $$D_{10} \frac{1}{(\delta_{10}+1)} \frac{(\delta_9+2)(\delta_8+2) \ldots (\delta_2+2)}{(\delta_9+1)(\delta_8+1) \ldots (\delta_2+1)} +$$

$$D_9 \frac{1}{(\delta_9+1)} \frac{(\delta_8+2)(\delta_7+2) \ldots (\delta_2+2)}{(\delta_8+1)(\delta_7+1) \ldots (\delta_2+1)} +$$

$$\ldots D_3 \frac{1}{(\delta_3+1)} \frac{(\delta_2+2)}{(\delta_2+1)} + D_2 \frac{1}{(\delta_2+1)} + D_1$$

Figure 7:
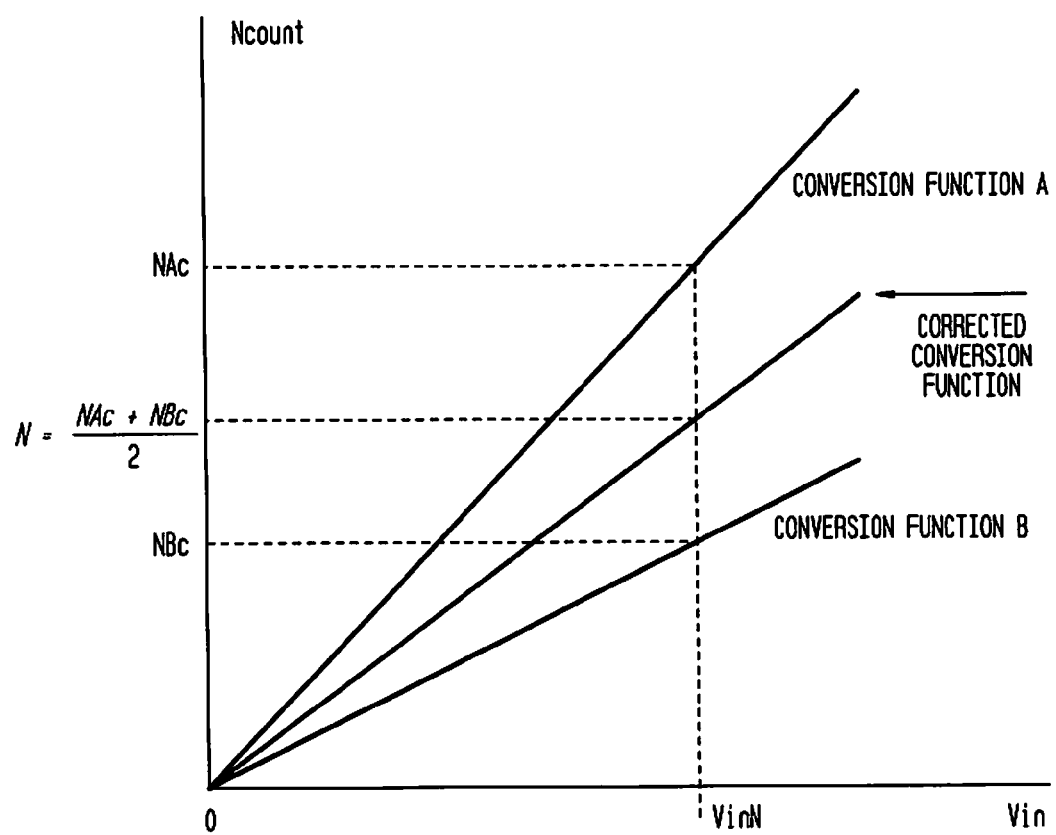
FIG. 7 shows conversion functions given by A and B configurations of a most-significant-bit (MSB) pipeline element circuit 150.

By way of illustrative example, assuming for example that a capacitor mismatch error exists only in a major significant bit pipeline element circuit 150 of ADC 155 (see FIG. 8), the conversion functions given by A and B configurations of an MSB pipeline element circuit 150 differ as shown in FIG. 7. The averaging of digital conversion codes obtained using the A and B configurations of a pipeline circuit element 150 result in an improved conversion function with a smaller error. The residue of the mismatch error $\delta i$ with respect to a binary bit weighting coefficient $w_i$ after averaging for a state Di may be estimated by expression (6) as follows:

$$w_i = \frac{1}{2}\left(1 + \delta_i + \frac{1}{1+\delta_i}\right) 2^{i-1} \cong 2^{i-1}\left(1 + \frac{\delta_i^2}{2}\right) \quad (6)$$

Expression (6) shows that a quite pronounced error reduction results, assuming that small values of $\delta i$ (usually less than 2%) are employed.

Figure 8:
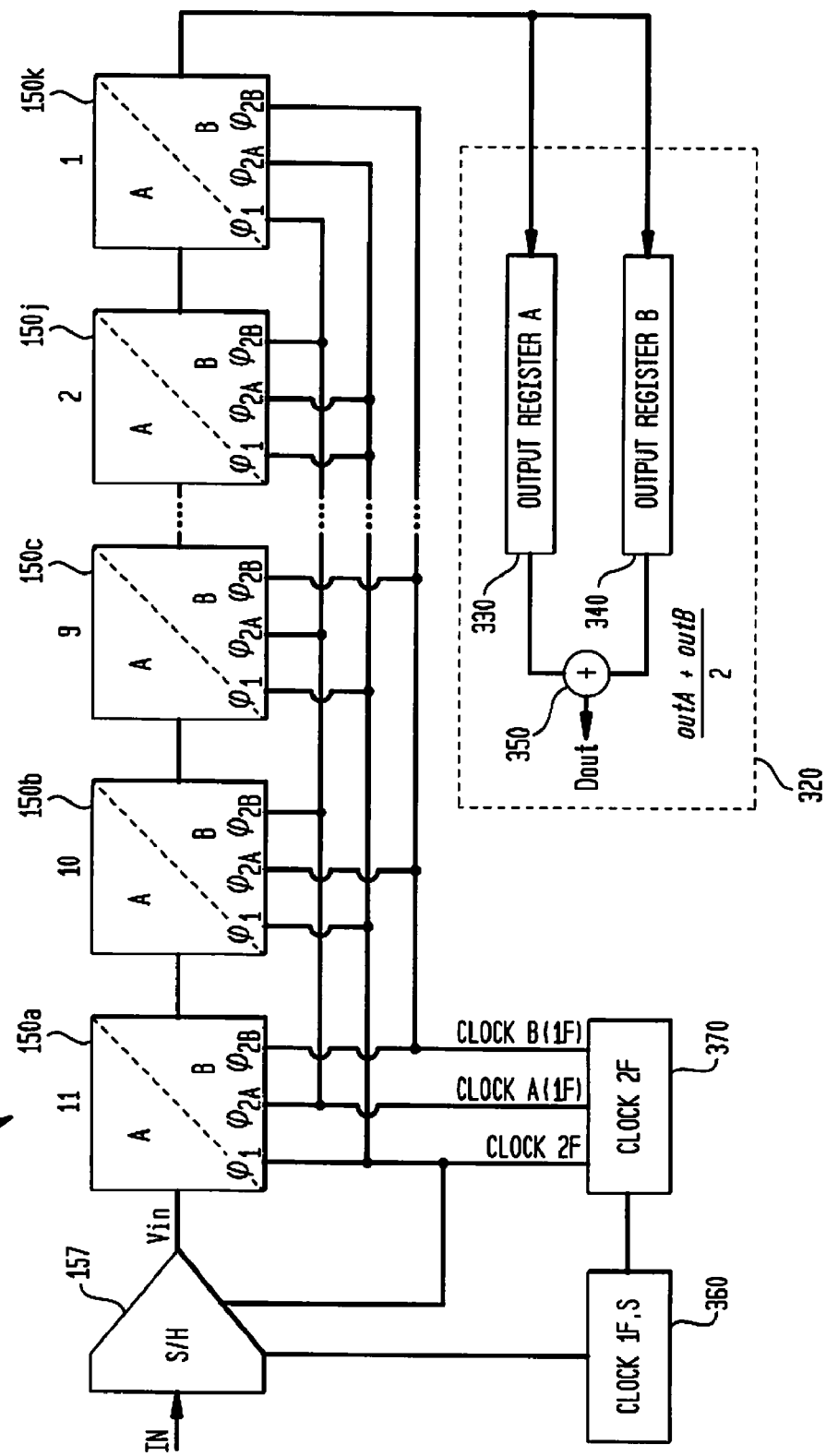
FIG. 8 shows one embodiment of pipeline analog-to-digital converter (ADC) 155.

Continuing to refer to FIGS. 6 and 8, there is now described a more detailed and thorough explanation of the operation of one embodiment of pipeline circuit element 150 and corresponding ADC 155. It is to be understood that many modifications, permutations and changes to pipeline element circuit 150 and ADC 155 can be made without departing from the spirit and scope of the present disclosure, and that the specific implementations described herein are not meant to be limiting with respect to alternative embodiments not described or shown explicitly. Pipeline element circuit 150 of FIG. 6 (or any one of pipeline element circuits 150*a* through 150*k* in FIG. 8) forms a portion of pipeline ADC 155, and in one embodiment comprises sample-and-hold circuit 157 configured to provide input voltage Vin at an output terminal thereof. First comparator 170 comprises a first negative input terminal operably connected to a first reference voltage Vr and a first positive input terminal operably connected to input voltage Vin. The first comparator 170 provides a first comparator output 200. Second comparator 180 comprises a second negative input terminal operably connected to second reference voltage −Vr and a second input terminal operably connected to input voltage Vin. Second comparator 180 provides a second comparator output 210

As shown in FIG. 6, multiplexer 190 is configured to receive as inputs thereto first comparator output 200, second comparator output 210, first reference voltage Vr, second reference voltage −Vr, and ground. Multiplexer 190 provides multiplexer output 220, which is representative of one of the first reference voltage Vr, the second reference voltage −Vr, and ground. Note that according to some embodiments multiplexer output 220 may be scaled or its polarity changed with respect to the various inputs provided thereto. Multiplexer output 220 is based on the outputs provided thereto by first and second comparator inputs 200 and 210, which in turn are based on the inputs provided to comparators 170 and 180. Amplifier circuit 230 of FIG. 6 is configured to receive input voltage Vin and multiplexer output 220 as inputs thereto. Amplifier circuit 230 comprises amplifier 240 having an output Vout and positive and negative amplifier inputs, where the positive amplifier input is connected to ground. Amplifier circuit 230 further comprises first, second and third sets of switches 270 (corresponding to the first phase, control signals $\phi_1$, and switches 271, 272 and 273), 280 (corresponding to the second phase, control signals $\phi_{2A}$, and switches 281 and 282), and 290 (corresponding to the third phase, control signals $\phi_2$, and switches 291 and 292). As shown in FIG. 6, amplifier circuit 230 further comprises first capacitance C1 (or 300) and second capacitance C2 (or 310).

During a first phase, first set of switches 270 is closed, second and third sets of switches 280 and 290 are open, first and second capacitors C1 and C2 are arranged in parallel with respect to one another, and capacitors C1 and C2 are charged up by input voltage Vin through first set of switches 270.

During a second phase, first and second capacitors C1 and C2 are arranged in series respecting one another, second set of switches 280 is closed, first and third sets of switches 270 and 290 are open, and through second set of switches 280 second capacitor C2 is placed in the negative feedback loop of amplifier 240 between the negative amplifier input and amplifier output thereof. Also during the second phase, first capacitor C1 is charged up by multiplexer output 220 provided thereto, and a second output voltage VoutB representative of second capacitance C2 is presented at the output of amplifier 240.

During a third phase, first set of switches 270 is closed, second and third sets of switches 280 and 290 are open, first and second capacitors C1 and C2 are arranged in parallel with respect to one another, and capacitors C1 and C2 are charged up again by the same input voltage Vin as in the first phase through first set of switches 270.

During a fourth phase, first and second capacitors C1 and C2 are arranged in series respecting one another, third set of switches 290 is closed, first and second sets of switches 270 and 280 are open, and through third set of switches 290 first capacitor C1 is placed in the negative feedback loop of amplifier 240. Also during the third phase, second capacitor C2 is charged up by multiplexer output 220 provided thereto, and a first output voltage VoutA representative of first capacitance C1 is presented at the output of amplifier 240.

Continuing to refer to FIG. 6, in pipeline element circuit 150 first set of switches 270 comprises first, second and third switches 271, 272 and 273, respectively, second set of switches 280 comprises fourth and fifth switches 281 and 282, respectively, and third set of switches 290 comprises sixth and seventh switches 291 and 292, respectively.

In pipeline element circuit 150 of FIG. 6, and during the first phase, first capacitor C1 is charged up by input voltage V1 to a first charge through first switch 271 on the high side of first capacitor C1 and through third switch 273 to ground on the low side of first capacitor C1. Second capacitor C2 is charged up by input voltage Vin to a second charge through second switch 272 on the high side of second capacitor C2 and through third switch 273 to ground on the low side of capacitor C2.

Further in the pipeline element circuit of FIG. 6, during the third phase the first, second and third switches 271, 272 and 273 are closed, the fourth, fifth, six and seventh switches 281, 282, 291 and 292 are open, first capacitor C1 is charged up by input voltage Vin to a first charge through first switch 271 on the high side of first capacitor C1 and through third switch 273 to ground on the low side of first capacitor C1. Second capacitor C2 is charged up by input voltage Vin to a second charge through second switch 272 on the high side of second capacitor C2 and through third switch 273 to ground on the low side of second capacitor C2.

Also in the pipeline element circuit of FIG. 6, during the second phase the first, second, third, sixth and seventh switches 271, 272, 273, 291 and 292 are open, the fourth and fifth switches 281 and 282 are closed, and second capacitor C2 is placed in the negative feedback loop of amplifier 240 between the negative amplifier input and the amplifier output Vout through fifth switch 282. First capacitor C1 is charged up by multiplexer output 220 provided thereto through fourth switch 281.

Continuing to refer to pipeline element circuit 160 of FIG. 6, during the fourth phase the first, second, third, fourth and fifth switches 271, 272, 273, 281 and 282 are open, the sixth and seventh switches 291 and 292 are closed, and first capacitor C1 is placed in the negative feedback loop of amplifier 240 through seventh switch 292. The second capacitor C2 is charged up by multiplexer output 220 provided thereto through sixth switch 291.

Further as shown in FIG. 8, capacitor error compensation circuit 320 is configured to receive and process digital representations of the first and second output voltages VoutA and VoutB and provide output 350 therefrom, which at least substantially reduces capacitor mismatch errors occurring between first capacitance C1 and second capacitance C2. In some embodiments, capacitor mismatch error compensation circuit 320 further comprises first and second output registers 330 and 340 that are configured to receive digital representations of the first and second output voltages VoutA and Vout B as inputs thereto. Also in some embodiments, capacitor mismatch error compensation circuit 320 may further comprise an averaging circuit 350 that is configured to receive digital representations of the first and second output voltages VoutA and VoutB from first and second registers 330 and 340, where averaging circuit is a digital averaging circuit or any other suitable "averaging circuit." Moreover, and as shown in FIG. 6, first and second output voltages VoutA and VoutB may be scaled by a scaling factor D.

Referring now to FIG. 8, and in some embodiments, the effective number of bits (ENOB) of pipeline ADC 155 may be at least 10, 12, 14, or any other suitable number of bits according to the particular application at hand.

One of the advantages of the circuitry shown in FIGS. 6 and 8 is that smaller capacitors may be employed to form ADC 155. By way of example, first capacitance C1 and second capacitance C2 may be less than or equal to about 1,000 femtofarads, less than or equal to about 500 femtofarads, less than or equal to about 200 femtofarads, or less than or equal to about 100 femtofarads. In one embodiment, pipeline element circuits 150 form a portion of a CMOS circuit, and input voltage Vin has been filtered before being presented to the input signal terminal. Pipeline element circuits 150 may be incorporated into an integrated circuit, touchscreen controller, or touchpad controller that forms a portion a touchscreen device (such as a capacitive touchscreen device), a touch panel device (such as a capacitive touch panel or touchpad device), a mobile phone or an imaging device. In addition, note that sample-and-hold circuit 157 of FIG. 8 is configured to provide an updated input voltage during the fourth phase.

In other embodiments, and continuing to refer to FIGS. 6 and 8, there is provided a method of reducing capacitor mismatch errors in pipeline analog-to-digital converter (ADC) 155, where the method comprises the following steps. In pipeline element circuit 150, and during a first phase, input voltage Vin provided by sample-and-hold circuit 157 is presented to first and second capacitors C1 and C2 arranged in parallel in pipeline circuit 150. During a second phase, a second voltage corresponding to a second charge associated with the second capacitance is amplified and stored in pipeline element circuit 150. During a third phase, the same input voltage Vin as was presented during the first phase to first and second capacitors C1 and C2 is once again presented to first and second capacitors C1 and C2 arranged in parallel in pipeline circuit 150. During a fourth phase a first voltage corresponding to the first charge is amplified and stored in pipeline element circuit 150. After the first, second, third and fourth phases have been completed, digital representations of the first and second voltages, along with corresponding digital representations of the first and second voltages provided by other pipeline element circuits in the ADC, are averaged to produce a digital capacitor mismatch error corrected output Dout (see FIG. 8).

In addition, and in some embodiments, the method may further comprise filtering digital representations of the first and second voltages by digital filtering circuit 350 (see FIG. 8), which may be a digital averaging or other data processing circuit. The method may also comprise configuring first capacitance C1 and second capacitance C2 in parallel respecting one another during the first and third phases and in series respecting one another during the second and fourth phases.

Referring again to FIG. 8, there is shown one embodiment of pipeline ADC circuit architecture that digitally averages the capacitor mismatch errors of pipeline circuit elements 150a through 150k in pipeline ADC 155. Pipeline ADC 155 of FIG. 8 comprises sample-and-hold (S/H) circuit 157, which operates at the data acquisition rate of pipeline ADC 155. All pipeline element circuits 150a through 150k employ circuitry of the type shown in FIG. 6, which permits A and B configurations for the second and fourth phases described above to be employed. The control signal protocol corresponding to the pipeline ADC circuit operation of FIG. 8 is shown in FIG. 9(a). As shown in FIG. 9(a), each portion of the sampled data is enumerated as DAT1, DAT2, DAT3, . . . and is presented to each pipeline circuit element 150 twice during the first and third phases described above in connection with FIG. 6. ADC conversion codes for each portion or piece of input data are obtained using pipeline circuit elements 150a through 150b in the A and B configurations, and are shuttled separately to 'Output register A' (330) and 'Output register B' (340) shown in FIG. 8. Note that the shift registers required to collect digital data for each measured input signal, and that are presented to the ADC input from pipeline element circuits 150a through 150k, are not shown in FIG. 8, as those skilled in the art will understand and appreciate immediately. A digital average of output registers A and B is computed and derived for pipeline circuit elements 150 before final digital conversion codes are presented to the ADC output, where the capacitor mismatch errors corresponding to capacitors 300 and 310 in pipeline element circuits 150a through 150k are markedly decreased.

FIG. 9(b) shows corresponding data, clock and pipeline element configurations for the circuits of FIG. 6 and FIG. 8 when operated in accordance with the command signal protocol of FIG. 9(a). Interleaved clock signals (clock 2F or 370 derived from clock 1F, S or 360, and clocks A and B in FIG. 8) permit the second and third phases ($\phi_{2A}$ and $\phi_{2B}$) described above in connection with FIG. 6 to be implemented through corresponding terminals of pipeline element circuits 150a through 150k of pipeline ADC 155 at an acquisition frequency of F while each pipeline circuit element 150a through 150k operates at a sampling frequency of 2F. The circuits of FIGS. 6 and 8 permit the reduction of capacitor sizes by a factor of 10 times or more, while also significantly reducing capacitor mismatch errors in a 12 bit or more pipeline ADC, more about which is said below. The circuits of FIGS. 6 and 8 also permit amplifier circuits 230 to operate with low power consumption and consequent low heat dissipation.

Circuit performance relating to the contribution of capacitor mismatches on ADC resolution and efficiency using the above-described digital mismatch averaging circuits and techniques was simulated using foundry data based on mismatch capacitor statistics. Foundry data were based on measured mismatches of capacitors of the type and layout commonly employed in a pilot pipeline ADC design featuring 12-bit ENOB operation. Capacitor mismatch errors are primarily a function of capacitor size, and corresponded to foundry test structure data. The standard deviations of capacitor values for different pipeline circuit elements of a pilot ADC design are shown in FIG. 10.

Figure 11:
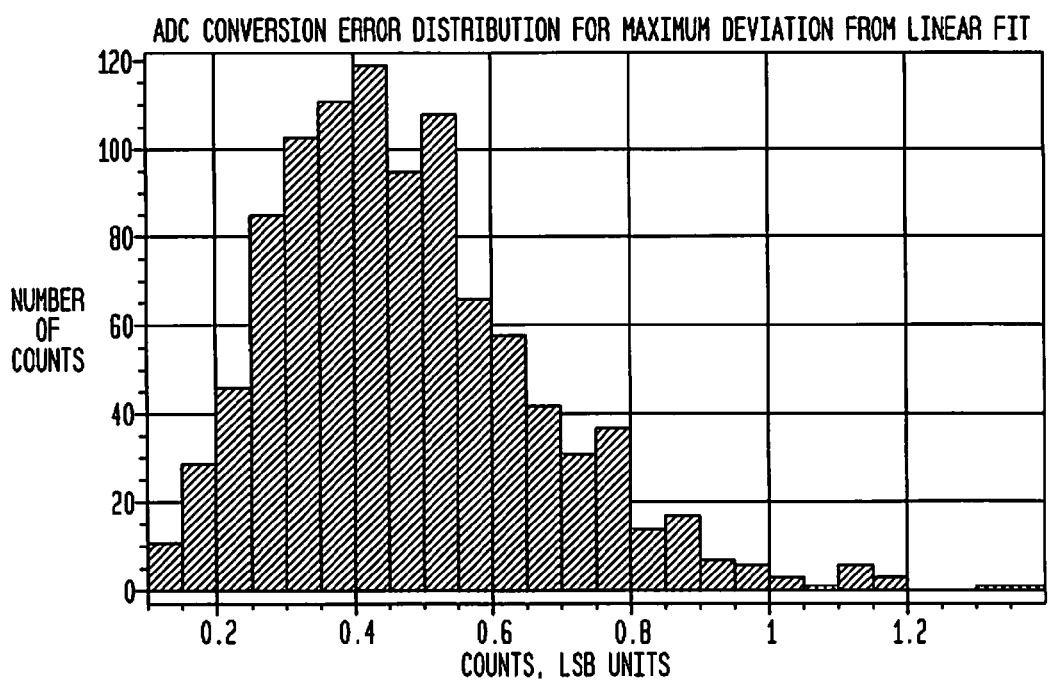
FIG. 11 shows a histogram of simulated absolute deviations of conventional pipeline ADC conversion functions according to one embodiment thereof.

FIG. 11 shows a histogram of simulated absolute deviations of conventional pipeline ADC conversion functions according to a linear fit of the conversion functions, where the simulation was obtained using 1,000 Monte Carlo events that employed a model for the pipeline ADC conversion function, where pipeline element circuit capacitor mismatch statistics were provided by the pilot ADC design parameters shown in FIG. 10.

Figure 12:
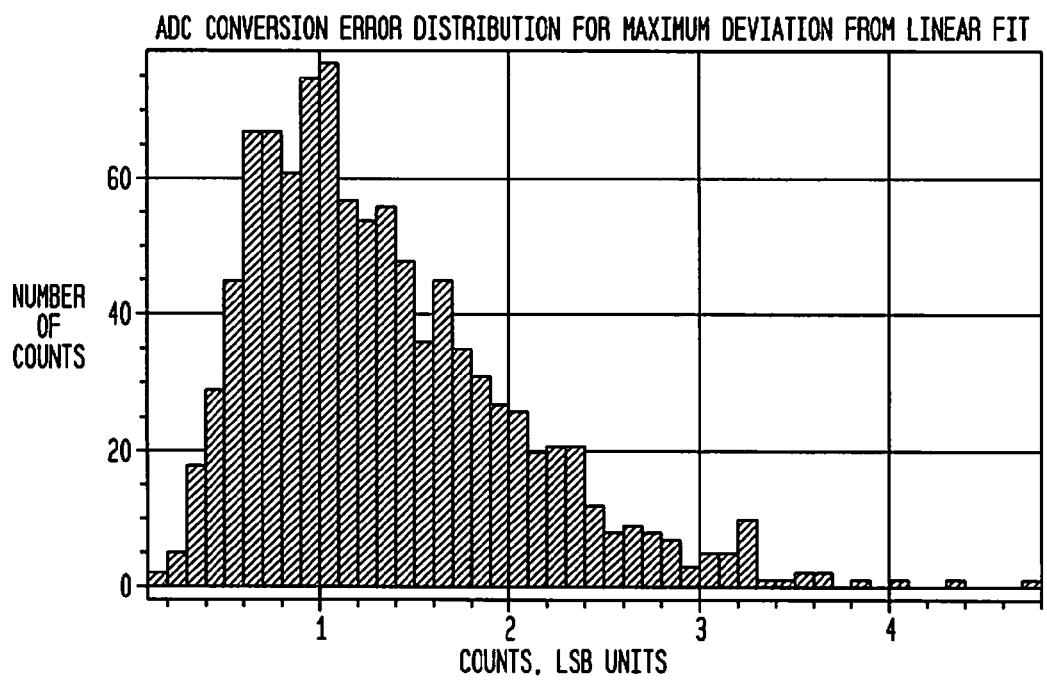
FIG. 12 shows a histogram similar to that of FIG. 11, but that was obtained using smaller capacitor values for C1 and C2.

FIG. 12 shows a histogram similar to that of FIG. 11, but that was obtained using a pipeline ADC of conventional design, where all capacitors 300 and 310 of pipeline circuit elements 150a through 150k were reduced to the smallest capacitance shown in FIG. 10, i.e. 100.8 fF. The results of FIG. 12 show a substantial increase in ADC conversion errors in a pipeline ADC design that employs small capacitors.

Figure 13:
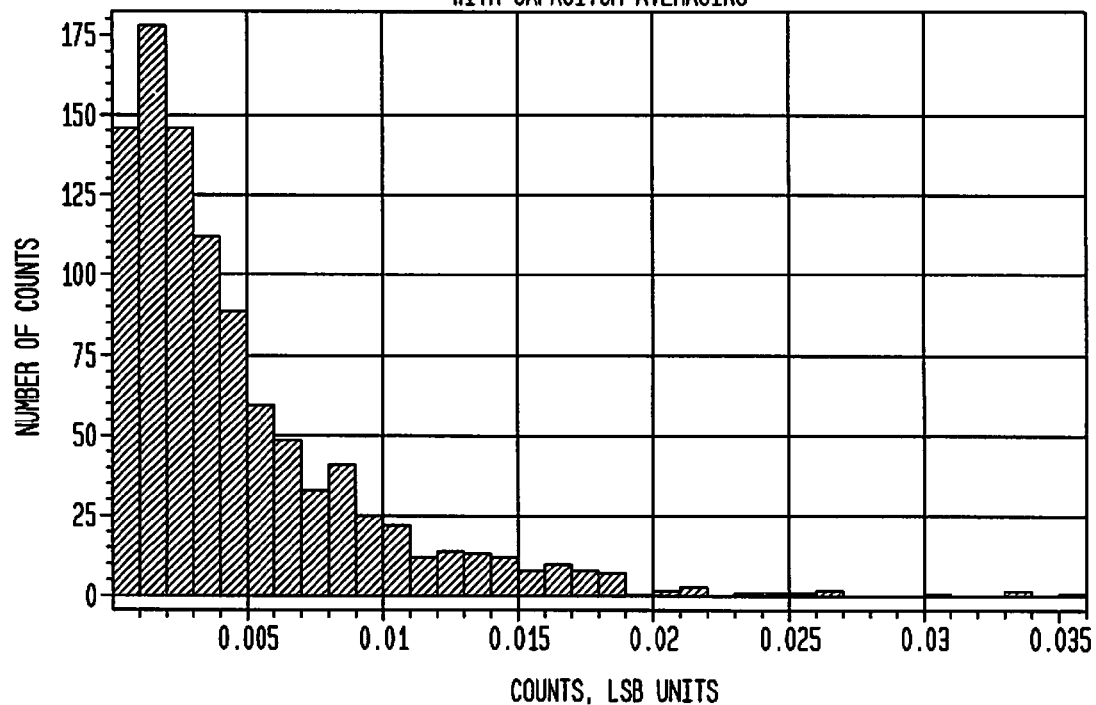
FIG. 13 shows another histogram resulting from the implementation of digital averaging circuitry and techniques.

A pipeline ADC circuit 155 implementing the above-described digital averaging circuitry results in a pronounced reduction of conversion errors caused by capacitor mismatch errors. This is shown by the simulated results of FIG. 13, where 100.8 fF capacitors were designated for capacitors 300 and 310 in all pipeline element circuits 150a through 150k.

Figure 14:
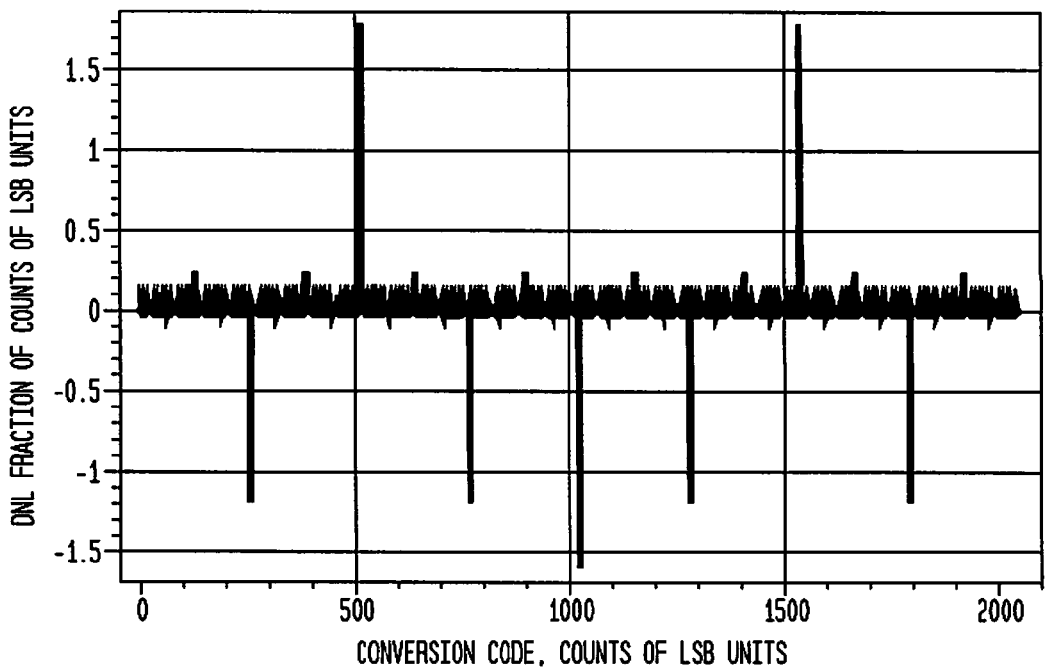
FIGS. 14 and 15 show the improvement of differential non-linearity (DNL) obtained through the use of the pipeline ADC digital averaging circuitry and techniques.
Figure 15:
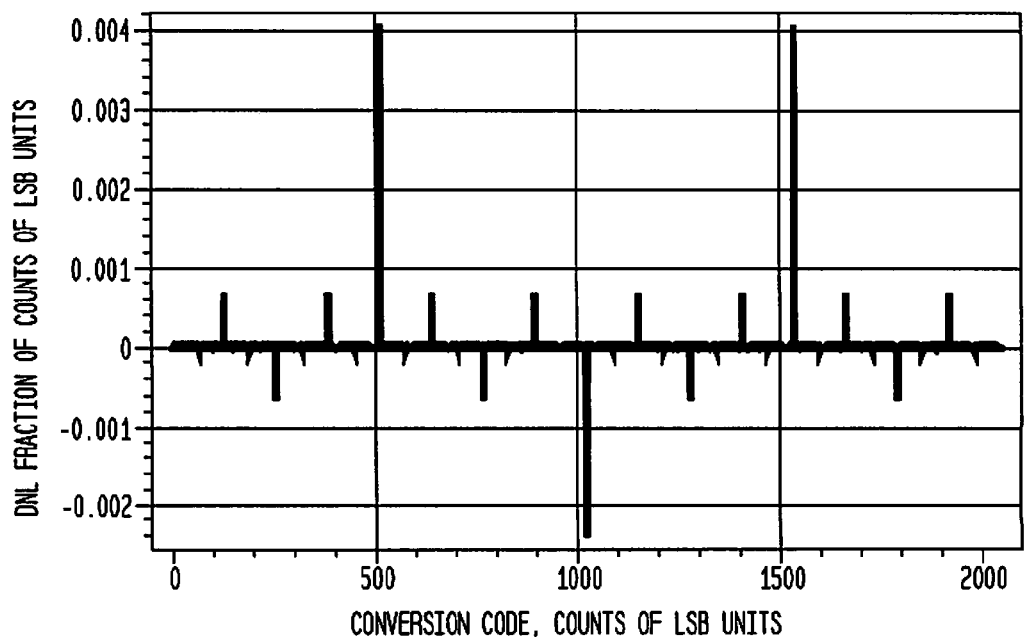

FIGS. 14 and 15 show the improvement of differential non-linearity (DNL) obtained through the use of the above-described pipeline ADC digital averaging circuitry and techniques in comparison to a conventional pipeline ADC design with small (100.8 fF) capacitors, both before and after calibration. In FIGS. 14 and 15, DNL is represented in terms of deviation of ADC conversion function steps from ideal normalized step sizes. As shown, missing codes presented in a conventional ADC design (which are indicated by absolute values of DNL above 1) completely disappear once the averaging ADC circuitry of FIGS. 6 and 8 is implemented using the same pipeline element circuit capacitors 300 and 310, while overall DNL is reduced significantly.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

I claim:

1. A pipeline element circuit in a pipeline analog-to-digital converter (ADC), comprising:
    a sample-and-hold circuit configured to provide an input voltage at an output terminal;
    a first comparator comprising a first negative input terminal operably connected to a first reference voltage and a first positive input terminal operably to connected to the input voltage, the first comparator providing a first comparator output;
    a second comparator comprising a second negative input terminal operably connected to a second reference voltage and a second positive input terminal operably connected to the input voltage, the second comparator providing a second comparator output;
    a multiplexer configured to receive as inputs thereto the first comparator output, the second comparator output, the first reference voltage, the second reference voltage, and ground, the multiplexer providing a multiplexer output representative of one of the first reference voltage, the second reference voltage, and ground, the multiplexer output being provided in accordance with the outputs provided by the first and second comparators, and
    an amplifier circuit configured to receive the input voltage and the multiplexer output as inputs thereto, the amplifier circuit comprising an amplifier having an output and positive and negative amplifier inputs, the positive amplifier input being connected to ground, the amplifier circuit further comprising first, second and third sets of switches, and a first capacitance and a second capacitance;
    wherein during a first phase the first set of switches is closed, the second and third sets of switches are open, the first and second capacitors are arranged in parallel with respect to one another and are charged up by the input voltage through the first set of switches;
    during a second phase the first and second capacitors are arranged in series respecting one another, the second set of switches is closed and the first and third sets of switches are open, and through the second set of switches the second capacitor is placed in a negative feedback loop between the negative amplifier input and the amplifier output, the first capacitor is charged up by the multiplexer output provided thereto, and a second output voltage representative of the second capacitance is presented at the amplifier output;
    during a third phase the first set of switches is closed, the second and third sets of switches are open, the first and second capacitors are arranged in parallel with respect to one another and are charged up again by the same input voltage as in the first phase through the first set of switches;
    during a fourth phase the first and second capacitors are arranged in series respecting one another, the third set of switches is closed and the first and second sets of switches are open, and through the third set of switches the first capacitor is placed in the negative feedback loop, the second capacitor is charged up by the multiplexer output provided thereto, and a first output voltage representative of the first capacitance is presented at the amplifier output.

2. The pipeline element circuit of claim 1, wherein the first set of switches comprises first, second and third switches, the second set of switches comprises fourth and fifth switches, and the third set of switches comprises sixth and seventh switches.

3. The pipeline element circuit of claim 2, wherein during the first phase the first, second and third switches are closed, the fourth, fifth, six and seventh switches are open, the first capacitor is charged up by the input voltage to a first charge through the first switch on the high side of the first capacitor and through the third switch to ground on the low side of the first capacitor, the second capacitor is charged up by the input voltage to a second charge through the second switch on the high side of the second capacitor and through the third switch to ground on the low side of the second capacitor.

4. The pipeline element circuit of claim 2, wherein during the third phase the first, second and third switches are closed, the fourth, fifth, six and seventh switches are open, the first capacitor is charged up by the input voltage to a first charge through the first switch on the high side of the first capacitor and through the third switch to ground on the low side of the first capacitor, the second capacitor is charged up by the input voltage to a second charge through the second switch on the high side of the second capacitor and through the third switch to ground on the low side of the second capacitor.

5. The pipeline element circuit of claim 2, wherein during the second phase the first, second, third, sixth and seventh switches are open, the fourth and fifth switches are closed, the second capacitor is placed in the negative feedback loop between the negative amplifier input and the amplifier output through the fifth switch, and the first capacitor is charged up by the multiplexer output provided thereto through the fourth switch.

6. The pipeline element circuit of claim 2, wherein during the fourth phase the first, second, third, fourth and fifth switches are open, the sixth and seventh switches are closed, the first capacitor is placed in the negative feedback loop through the seventh switch, and the second capacitor is charged up by the multiplexer output provided thereto through the sixth switch.

7. The pipeline element circuit of claim 1, wherein a capacitor mismatch error compensation circuit is configured to receive and process digital representations of the first and second output voltages and provide an output therefrom which at least substantially reduces capacitor mismatch errors occurring between the first capacitance and the second capacitance.

8. The pipeline element circuit of claim 7, wherein the capacitor mismatch error compensation circuit further comprises first and second output registers configured to receive the digital representations of the first and second output voltages as inputs thereto.

9. The pipeline element circuit of claim 8, wherein the capacitor mismatch error compensation circuit further comprises an averaging circuit configured to receive the digital representations of the first and second output voltages from the first and second registers.

10. The pipeline element circuit of claim 9, wherein the averaging circuit is a digital averaging circuit.

11. The pipeline element circuit of claim 1, wherein the first and second output voltages are scaled by a scaling factor D.

12. The pipeline element circuit of claim 11, wherein the input voltage is Vin, the first reference voltage is Vr, and the second reference voltage is −Vr.

13. The pipeline element circuit of claim 12, wherein D=1 when Vin>Vr>−Vr, D=0 when Vr>Vin>−Vr, and D=−1 when Vin<−Vr<Vr.

14. The pipeline element circuit of claim 11, wherein D corresponds to one bit from among a plurality of bits in the pipeline ADC.

15. The pipeline element circuit of claim 14, further comprising the pipeline ADC into which the pipeline element circuit is incorporated.

16. The pipeline element circuit of claim 15, wherein the effective number of bits (ENOB) of the pipeline ADC is at least 10.

17. The pipeline element circuit of claim 1, wherein the first capacitance and the second capacitance are less than or equal to about 1,000 femtofarads.

18. The pipeline element circuit of claim 1, wherein the first capacitance and the second capacitance are less than or equal to about 100 femtofarads.

19. The pipeline element circuit of claim 1, wherein the pipeline element circuit forms a portion of a CMOS integrated circuit.

20. The pipeline element circuit of claim 1, wherein the pipeline element circuit forms a portion of a touchscreen or touchpad controller.

21. The pipeline element circuit of claim 1, wherein the input voltage has been filtered before being presented to the input signal terminal.

22. The pipeline element circuit of claim 1, further comprising one of a touchscreen device, a touch panel device, a mobile phone and an imaging device into which the pipeline element circuit is incorporated.

23. The pipeline element circuit of claim 1, wherein the pipeline element circuit is configured to provide analog voltages and digital representations corresponding to one bit from among a plurality of pipeline element circuits and corresponding bits, the plurality of bits forming a digital word output by the pipeline ADC.

24. The pipeline element circuit of claim 1, wherein the sample-and-hold circuit provides an updated input voltage during the fourth phase.

25. A method of reducing capacitor mismatch errors in a pipeline analog-to-digital converter (ADC), comprising:
in a pipeline element circuit, and during a first phase, presenting an input voltage provided by a sample-and-hold circuit to first and second capacitors arranged in parallel in the pipeline element circuit;
in the pipeline element circuit, and during a second phase, amplifying a second voltage corresponding to a second charge associated with the second capacitance and storing the second voltage;
in the pipeline element circuit, and during a third phase, again presenting the same input voltage of the first phase to the first and second capacitors arranged in parallel;
in the pipeline element circuit, and during a fourth phase, amplifying a first voltage corresponding to the first charge and storing the first voltage, and
after the first, second, third and fourth phases have been completed, sending digital representations of the first and second voltages through corresponding registers to a digital averaging circuit for subsequent averaging, and providing a digital capacitor mismatch error corrected output therefrom.

26. The method of claim 25, wherein digital representations of the first and second voltages are filtered by a digital filtering circuit.

27. The method of claim 26, wherein the digital filtering circuit is a digital averaging circuit.

28. The method of claim 25, wherein the pipeline element circuit further comprises a first comparator comprising a first negative input terminal operably connected to a first reference voltage and a first positive input terminal configured to receive the input voltage, the first comparator providing a first comparator output, a second comparator comprising a second negative input terminal operably connected to a second reference voltage and a second input terminal configured to receive the input voltage, the second comparator providing a second comparator output, a multiplexer configured to receive as inputs thereto the first comparator output, the second comparator output, the first reference voltage, the second reference voltage, and ground, the multiplexer providing a multiplexer output representative of one of the first reference voltage, the second reference voltage, and ground, the multiplexer output being provided in accordance with the first and second comparator inputs, and an amplifier circuit configured to receive the input voltage and the multiplexer output as inputs thereto, the amplifier circuit comprising an amplifier having an output and positive and negative amplifier inputs, the positive amplifier input being connected to ground, the amplifier circuit further comprising first, second and third sets of switches.

29. The method of claim 25, wherein the first capacitance and the second capacitance are arranged in parallel respecting one another during the first and third phases and in series respecting one another during the second and fourth phases.

* * * * *